United States Patent [19]

Okumura

[11] Patent Number: 4,575,638
[45] Date of Patent: Mar. 11, 1986

[54] THIN FILM PHOTOELECTRIC CONVERTING DEVICE

[75] Inventor: Fujio Okumura, Tokyo, Japan

[73] Assignee: NEC Corporation, Tokyo, Japan

[21] Appl. No.: 489,748

[22] Filed: Apr. 29, 1983

[30] Foreign Application Priority Data

May 4, 1982 [JP] Japan .................................. 57-74885
May 10, 1982 [JP] Japan .................................. 57-77889

[51] Int. Cl.$^4$ ............................................ H01J 40/14
[52] U.S. Cl. ..................................... 250/578; 358/213
[58] Field of Search ................ 250/578; 358/212, 213; 357/31, 32

[56] References Cited

U.S. PATENT DOCUMENTS 4,288,702 9/1981 Ozawa et al. ......................... 357/32
4,424,590 1/1984 Ozawa .................................. 250/578
4,449,147 5/1984 Ogaasawara ......................... 358/213

OTHER PUBLICATIONS

"A Proposed Novel Amorphous-Silicon Image Sensor" by Masakiyo Matsumura et al., Proceedings of the 12 Conference on Solid State Devices, Tokyo, 1980; Japanese Journal of Applied Physics, vol. 20 (1981) Supplement 20-1, pp. 311-314.
"Amorphous SI:H Contact Linear Image Sensor with SI$_3$N$_4$ Blocking Layer" by S. Kaneko et al., 1982 IEEE, IEDM 82, pp. 328-331.
"A 2048-Element Contact Type Linear Image Sensor for Facsimile" by Kazumi Komiya et al., 1981 IEEE, IEDM 81, pp. 309-312.
"A Contact-Type Linear Sensor with a GD a-Si:H Photodetector Array" by Y. Kanoh et al., 1981 IEEE, IEDM 81, pp. 313-316.
"Design and Evaluation of A4 Amorphous Si Hybrid Image Sensor" by T. Ozawa et al., IMC 1982 Proceedings, Tokyo, May 24-26, 1982.

Primary Examiner—David C. Nelms
Assistant Examiner—J. Gatto
Attorney, Agent, or Firm—Charles E. Pfund

[57] ABSTRACT

A thin film photoelectric converting device comprises a plurality of sensor blocks, each block including a thin film transistor array which is paired with a storage type image sensor array, the thin film transistor array and said image sensor array being formed on the same insulating substrate, means for simultaneously turning ON as a group the thin film transistors in each block and for sequentially driving the thin film transistors of said blocks, and reading means comprising detection means and scanning means for sequentially reading electric charge signals sensed by the storage type image sensor elements in each block.

The detection means includes a plurality of detectors of the same number as that of sensor elements in each block, said detectors simultaneously detecting electric charge signals of said image sensor elements in each block.

The scanning means scans and reads out outputs of said detectors.

5 Claims, 12 Drawing Figures

THIN FILM PHOTOELECTRIC CONVERTING DEVICE

BACKGROUND OF THE INVENTION

This invention relates to a thin film photoelectric converting device, and more particularly a contact type image sensor utilized as a manuscript reading device such as a facsimile telegraph.

In recent years, in a manuscript reading device such as a facsimile telegraph, various types of the contact type sensors have been developed in which photoelectric systems can be miniaturized so that they correspond to respective manuscripts for the purpose of miniaturizing and decreasing the cost of manufacturing of the device. These previous sensors can be classified into storage and continuous type according to their method of driving. According to the former type, electric charges generated when one line of such photoelectric converting elements as photodiodes is scanned with light are integrated or stored and read out so that there are such advantages that the signal ratio between dark and bright is high and that response speed to light is high. Present day sensors utilize a chalcogenide film or an amorphous silicon film. Sensors utilizing the latter type do not store electric charge but detect the strength of light reflected at the surface of a manuscript as the variation in the resistance of the sensor by utilizing its characteristic as a photo-conductor. Thus, as it utilizes the secondary current of light its light response is slow.

Presently used storage type image sensors are defective in that it requires a specific IC circuit having performances of a shift register and an analog switch array. With the continuous type image sensor, by providing a rectifying contact for one electrode, it is possible to drive in a matrix mode, which can not only reduce the number of switches but also makes it unnecessary to use the specific IC circuit, thus reducing the cost. The defects of the storage type image sensor can be obviated by constructing a portion corresponding to the IC as a thin film transistor fabricated on the same substrate. This method, however, is not yet practical for the following two reasons. First reason lies in that the mobility of charge carries in the thin film transistor is generally much lower than that of a transistor made of a single crystal whereby its response is slow and high speed switching is impossible. Another reason lies in that it is difficult to uniformly fabricate a thin film transistor having a large area of a high reproducibility, and as an integrated circuit. Where a relatively high operating speed thin film transistor array and a contact type image sensor array are formed on the same substrate the manufacturing process becomes extremely complicated.

SUMMARY OF THE INVENTION

Accordingly, it is an object of this invention to provide a thin film photoelectric converting device which utilizes a storage type image sensor array and a thin film transistor array which can operate at a high speed and can eliminate use of an integrated circuit and obviate various difficulties described above.

According to this invention, there is provided a thin film photoelectric converting device comprising a plurality of sensor blocks, each block including a thin film transistor array which is paired with a storage type image sensor array, the thin film transistor array and the image sensor being formed on the same insulating substrate, means for simultaneously turning ON the thin film transistors in each block and for sequentially driving the thin film transistors of said blocks, and reading means comprising detection means and scanning means for sequentially reading electric charge signals sensed by the storage type image sensor elements in each block, the detection circuit including a plurality of detectors of the same number as that of sensor elements in each block, the detectors simultaneously detecting electric charge signals of the image sensor elements in each block and the scanning means for scanning and reading out the electric charge signals.

DESCRIPTION OF THE PREFERRED EMBODIMENTS

Figure 1:
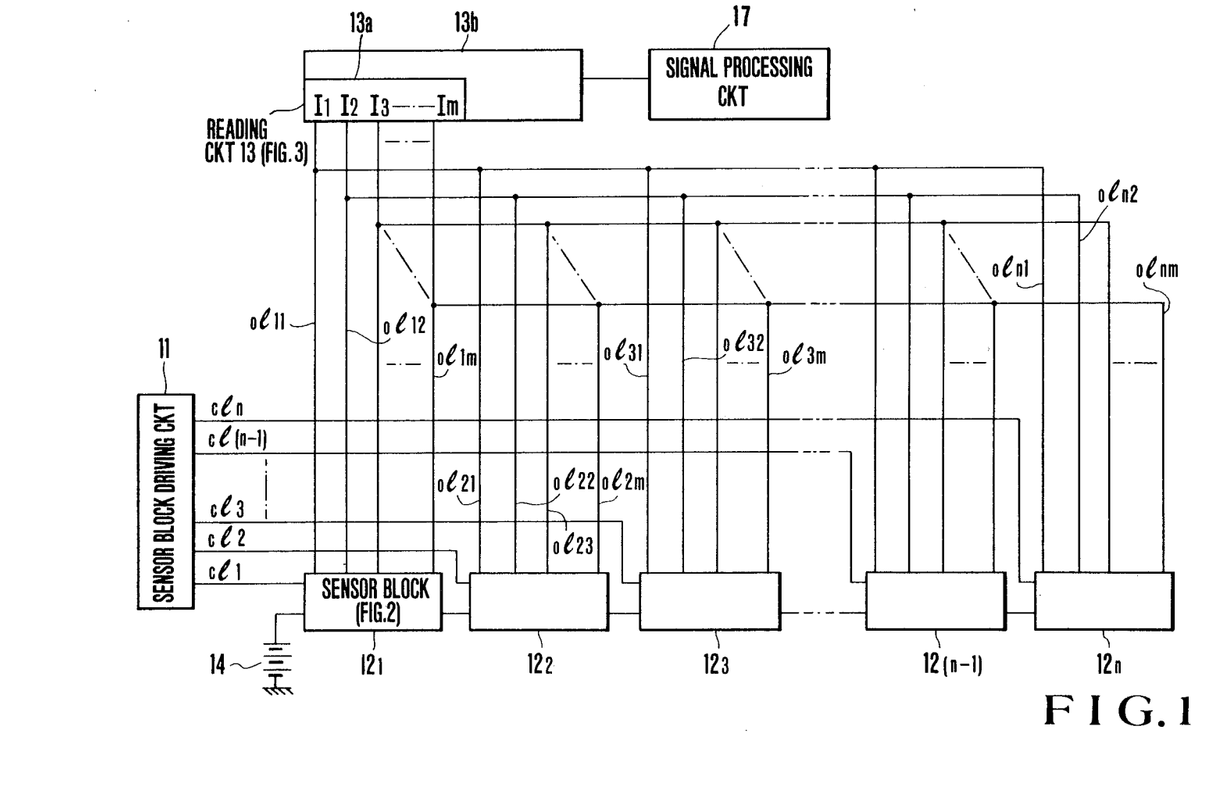
FIG. 1 is a block diagram showing the basic construction of the thin film photoelectric converting device embodying the invention.

The embodiment of this invention shown in FIG. 1 comprises a sensor block driving circuit which sequentially energizes or scans a plurality of sensor blocks $12_1$ to $12_n$ each including a storage type image sensor array and a thin film transistor array for producing signals taken out from respective blocks on corresponding control lines $cl_1$ to $cl_n$. The detail of the blocks $12_1$ to $12_n$, typically block $12_1$, is shown in FIG. 2.

Figure 2:
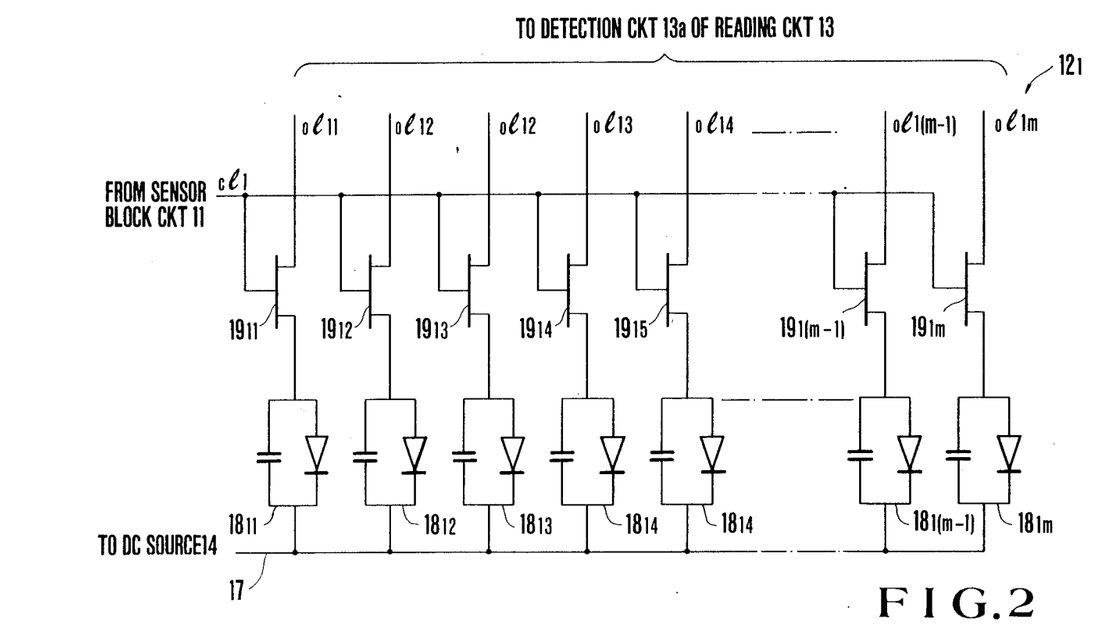
FIG. 2 is a connection diagram showing one example of the sensor block shown in FIG. 1.
Figure 3:
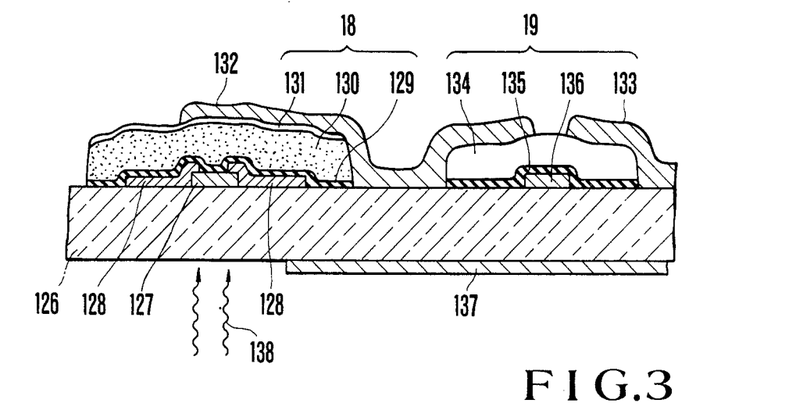
FIG. 3 is a sectional view showing one example of the construction of the sensor block shown in FIG. 2.

As shown in FIG. 2 the sensor block $12_1$ comprises m storage type image sensors $18_{11}, 18_{12} \ldots 18_{1m}$ with their one terminals connected to a common electrode 17 and the other terminals connected to a reading circuit to be described later through the output electrodes (sources - drains) of gating thin film transistors (TFT) $19_{11}, 19_{12} \ldots 19_{1m}$. The common electrode 17 is connected to a source of supply 14 which is provided for the purpose of applying an operating voltage to respective sensor blocks. The gate electrodes of respective TFTs $19_{11}$–$19_{1m}$ are commonly connected to one $cl_1$ of the control lines of the sensor block driving circuit 11. Control pulses for taking out read-out-outputs from respective blocks sequentially appear on these control lines $cl_1$–$cl_n$, respectively. Since a storage type image sensor can be equivalently shown by a capacitor and a photodiode in parallel, in FIG. 2 the image sensors are shown by the equivalent circuits. The detail of the construction comprising a storage type image sensor element and a thin film transistor in series therewith of the sensor block shown in FIG. 2 is shown in FIG. 3.

In this embodiment, both the sensors and transistors are made of amorphous silicon. In FIG. 3, reference numeral 126 designates a glass substrate, 127 a transparent common electrode made of $SnO_2$ or ITO, 128 a light shielding film made of such metal as Cr which determines the length of the opening of a sensor in the direction of sub-scanning. 129 represents a $Si_3N_4$ or $SiO_2$ film having a thickness of about 100 to 200 angstroms, 130 an amorphous silicon film having a thickness of about 2 to 3 microns and which is slightly doped with boron or oxygen to have a light resistance characteristic. The $Si_3N_4$ film 129 and the P type amorphous silicon film 131 act as blocking layers for preventing charge injection. Further, the amorphous silicon layer 130 acts to form electric charge when irradiated with light; elements 129 to 131 constitute the storage type image sensor 18 shown in FIG. 2. 132 designates an Al electrode acting as the upper electrode and the drain electrode of the TFT, 133 an Al source electrode, 134 a non-doped amorphous film having a thickness of 1 to 2 microns, 135 an $Si_3N_4$ or $SiO_2$ film having a thickness of 0.1 to 0.5 microns and acting as the insulating film of the TFT. 136 designates a gate electrode made of Al. Components 133 to 136 constitute a thin film transistor 19 shown in FIG. 2. 137 shows a light shielding film that prevents light from impinging upon the TFT 19. According to the above construction when light impinges upon the device in a certain direction, this light shielding film 137 should be provided over the TFT 19 because the amorphous silicon utilized in the thin film transistor is photoconductive. Arrows 138 show light from a manuscript.

Referring again to FIG. 1, the output lines or signal lines of respective TFTs $19_{i1}$, $19_{i2}$ ... $19_{im}$ (where i varies between 1 and m) of each of the sensor blocks $12_1$ to $12_n$ are respectively connected to the reading circuit 13 constituted by a detection circuit 13a including m detectors, and a scanning circuit 13b which scans the detectors of the detection circuit 13a. If necessary, to the rear side of the scanning circuit 13b may be connected an amplifier, a buffer or an integrator.

Figure 4:
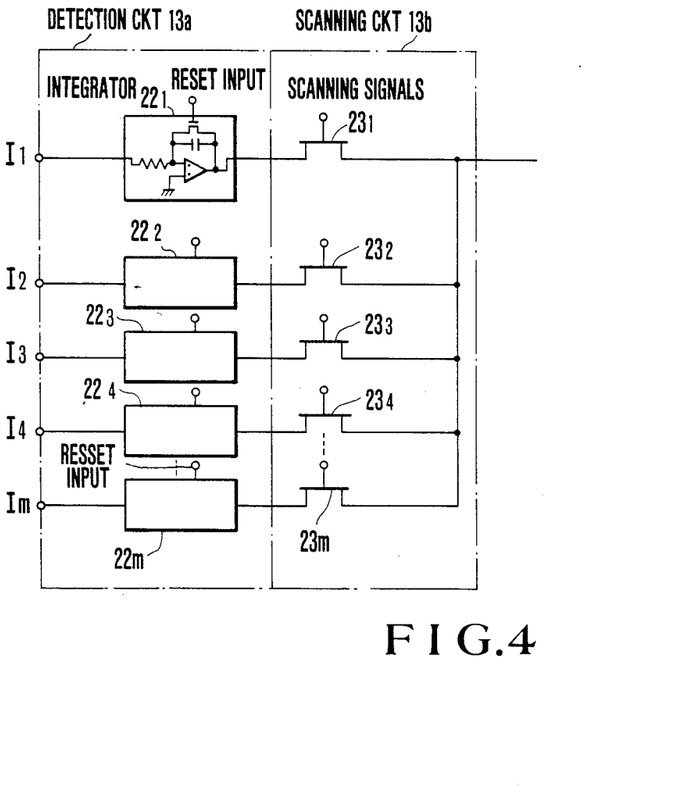
FIG. 4 is a block diagram showing one example of the reading circuit shown in FIG. 1.

One example of the detection circuit 13a is shown in FIG. 4. As shown, the output lines of respective sensor blocks $12_1$ through $12_n$ are respectively connected to the input terminals $I_1, I_2 \ldots I_n$ of the detection circuits 13a. More particularly the bit terminals corresponding to respective sensor blocks, for example, signal line $o1_{11}$ of the sensor block $12_1$, signal line $o1_{21}$ of the sensor block $12_2$ ... and the signal line $o1_{n1}$ of the sensor block $12_n$ are commonly connected to the input terminal $I_1$ of the detection circuit 13a, while the signal line $o1_{1m}$ of the sensor block $12_1$, the signal line $o1_{2m}$ of the sensor block $12_2$ ... and the signal line $o1_{nm}$ of the sensor block $12_n$ are commonly connected to the input terminal $I_m$ of the detection circuit 13a.

These input terminals $I_1$ to $I_m$ are respectively connected to detectors comprising resettable integrators $22_1, 22_2 \ldots 22_m$ of the detection circuit 13a. Each integrator is of a well known type comprising an operational amplifier, a resistor, a capacitor, and a reset transistor for example and the outputs of these integrators $22_1$ through $22_m$ are commonly applied to a signal processing circuit 17 through the analog switching field effect transistors $23_1, 23_2 \ldots 23_m$ which constitute a scanning circuit 136. Although not shown, in the scanning circuit 13b, in addition to transistors $23_1, 23_2 \ldots 23_m$, is provided a control circuit for sequentially turning ON these transistors to sequentially scan the outputs of the detection circuit 13a.

The apparatus of this invention having the construction as above described operates as follows. It is firstly assumed that the signal charges have been induced on the sensors. Then starting from the first bit the TFTs $19_{11}$ through $19_{1m}$ of the sensor block $12_1$ is turned ON by the sensor block driving circuit 11 and the output of the TFTs $19_{11}$ through $19_{1m}$ are applied to the input terminals $I_1$ through $I_m$ via lines $o1_{11}$ through $o1_{1m}$ so that signal charges of the sensor elements $18_{11}$ through $18_{1m}$ corresponding to the first through m bits are simultaneously detected by the detecting circuit 13a of the reading circuit 13.

In the detection circuit 13a shown in FIG. 4, the signal charges outputted by the image sensors $18_{11}$ through $18_{1m}$ are integrated by integrators $22_1$ through $22_m$ to convert signal charges into voltage signals. The outputs of these integrators $22_1$ through $22_m$ are read out by sequentially turning ON/OFF the switching transistors $23_1$ through $23_m$ in accordance with the scanning signals of a control circuit, not shown.

Figure 5:
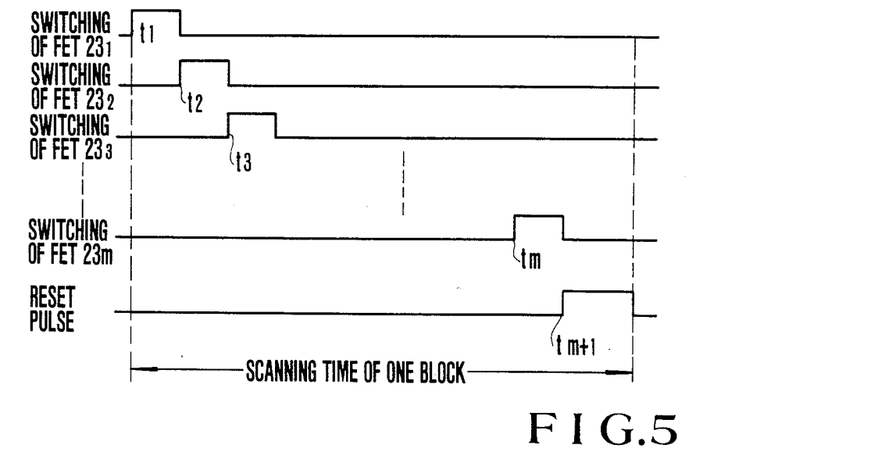
FIG. 5 is a timing chart useful to explain the operation of the reading circuit.

The timing of switching the transistors $23_1$ through $23_m$ is shown in the timing chart in FIG. 5. As shown, transistors $23_1$ through $23_m$ are sequentially turned ON by applying gate pulses at times $t_1$ through $t_m$. In this manner, the switching array ($23_1$ through $23_m$) of the scanning circuit 13b in the reading circuit 13 is sequentially switched from the first bit through mth bit to read onput signals of the integrators $22_1$ through $22_m$. Although the OFF timing of the TFT array 19 may vary depending upon the read out time (this will be described later with reference to FIGS. 6 and 7), it is necessary for the TFT array to become perfectly OFF before the TFT of the next block is switched. Finally the charges remaining in the reading circuit 13 is perfectly removed by reset pulses supplied to the reset input terminals of respective integrators 22 at a time $t_{m+1}$.

Then the TFT array 19 of the next block $12_2$ is switched. This operation is continued to the nth sensor block $12_n$. In this manner, by switching only once the TFT of each block for transferring charges, the switching speed can be increased even when thin film transistors having slow operating speeds or slow response characteristics are used. For example, where a thin film transistor having a response time of 100 microsec. is used as the switch, each block comprises 10 bits, and where the scanning speed per bit in the reading circuit 13 is 5 microsec., the scanning speed of one block is 200 to 250 microsec. When converting this to a uniform speed, the switching would be effected at a speed of 20 to 25 microsec./bit. Since it takes 200 microsec. for turning ON and OFF a thin film transistor, the switching speed of this invention is improved by a factor of 10.

Now the effect of the unequal switching characteristics will be considered. The problem caused by unequal ON/OFF threshold voltages can be solved by selecting a suitable gate voltage, so that the remaining main problems are the ON resistance and the response characteristic caused thereby. However, in the charge storage type reading operation, since the signal is electric charges, even when the ON resistors of the thin film transistor varies, there would be no trouble when all signal charges enter in the detection circuit 13a, so that only the response speed is important. According to the converting device of this invention, fast switching becomes possible even with thin film transistors having a slow response characteristic. Moreover, as it is possible to make the number m of the elements in each block to be a suitable value, by selecting a suitable m by taking into consideration inequality in the response characteristic, this problem can also be solved. This makes it possible to compensate for all defects of the film transistor.

As shown by the embodiment shown in FIG. 3, in the thin film photoelectric converting device of this invention, the sensor and the thin film transistor can be formed on the same substrate with the same material. It is also possible to continuously form a film with the same manufacturing equipment where a suitable method is used, thus enabling to manufacture the device at a low cost with high reproduceability and reliability. As other examples, image pick up element such as Saticon (trade name), CdS or CdSe may be used as the storage type image sensor, CdS or CdSe may be used for fabricating thin film transistors. Alternatively, polycrystalline material comprising polycrystalline silicon formed by vapor depositing silicon, or formed by laser annealing amorphous silicon can also be used.

Figure 6:
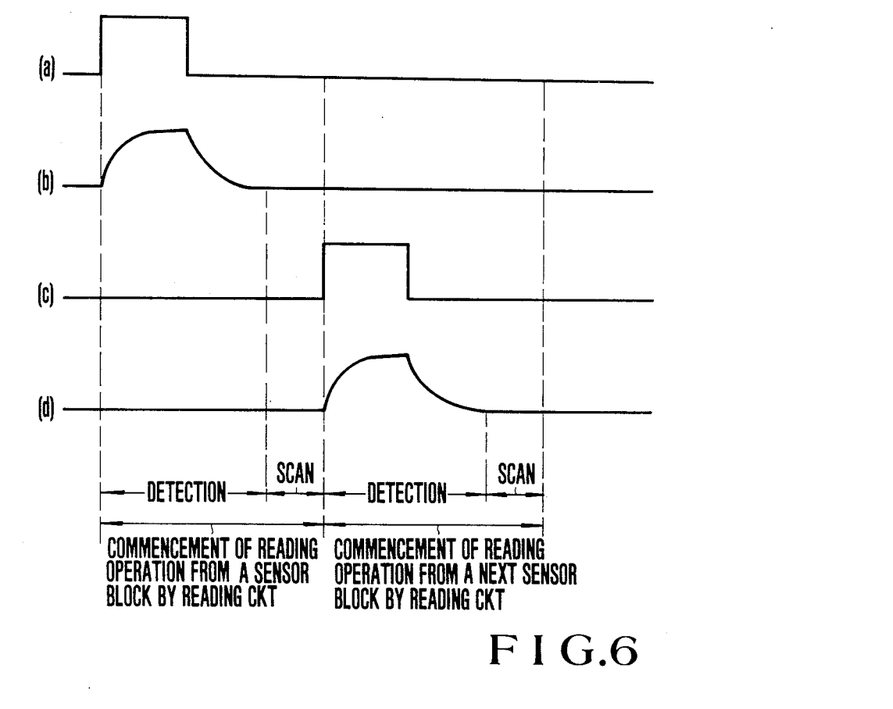
FIGS. 6 and 7 are timing charts for explaining the operation of the sensor block in relation to the output of the driving circuit.
Figure 7:
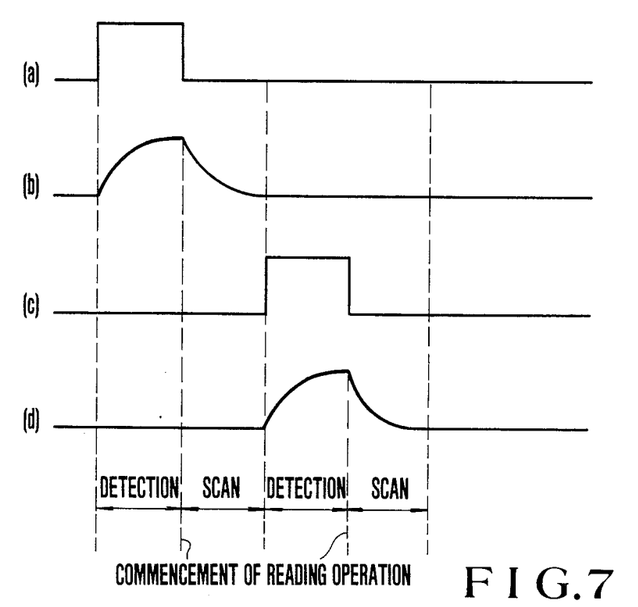

The timings of the switching operation of the thin film transistor array 19 and the read out operation of the reading circuit 13 will be considered with reference to FIGS. 6 and 7 in which curves (a) and (c) show control pulses sent out on the control lines $cl_i$ and $cl_{i+1}$ on the output side of the sensor block driving circuit 11, and curves (b) and (d) show resistence variations appearing on the output side of the thin film transistor 19 which responds to the supply of the control pulses.

As can be noted from FIG. 6, signal charges transferred to the reading circuit 13 after the TFT 19 has been completely turned OFF are sequentially read, and the reading operation is commenced when the TFT is substantially turned ON. Meanwhile, in FIG. 7 the reading operation of signal charges transferred to the reading circuit 13 is commenced when the TFT was turned ON and the ON time of the TFT has substantially passed. The former represents the timing when the noise produced by the switching operation of the TFT is so large as that can not be neglected, while the latter the timing when the noise is negligibly small. The noise mainly consists of those caused by the feedthrough of the switching pulse through the capacitance between the gate and source or drain electrodes of the TFT, or caused by the variation in the channel charge caused by ON/OFF operations. Such noise can be cancelled by producing an opposite phase noise by turning OFF the TFT as shown in FIG. 6. When reading is made thereafter, it is possible to produce signals of reduced noise. However, when the noise is sufficiently small, it is advantageous to use the timing shown in FIG. 7 which makes high the scanning speed of the sensor blocks. Of course the timing is not limited to these two cases.

Figure 8:
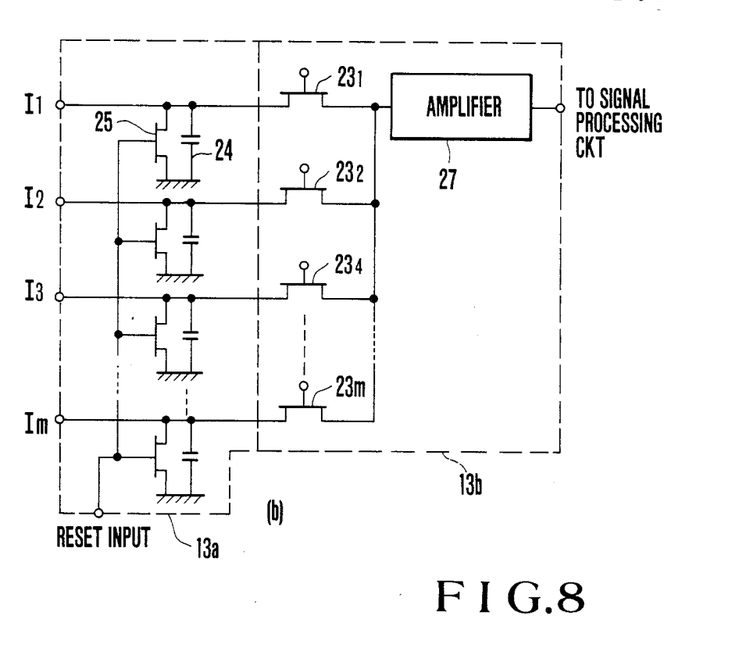
FIG. 8 is a connection diagram showing a modified reading circuit.

FIG. 8 shows a modification of FIG. 4 in which charge accumulating capacitor 24 and a resetting field effect transistors 25 are connected in parallel respectively between the input terminals $I_1, I_2 \ldots I_m$ of the detecting circuit 13a and ground.

All gate electrodes of the transistors 25 are commonly connected to the reset input of the detection circuit 13a.

The nongrounded terminals of the capacitors 24 and transistors 25 of the detection circuit 13a are connected to the scanning circuit 13b to act as the output terminals of the capacitors 24. In the same manner as in the embodiment shown in FIG. 4, the scanning circuit 13b comprises switching transistors, the output sides thereof being commonly connected to an amplifier 27 in the form of an integrator or a buffer.

This modification operates in the same manner as the embodiment shown in FIG. 4.

Although in the foregoing embodiment the common electrode 17 was connected to the DC source 14 the common electrode 17 may be grounded and the DC source may be incorporated into the reading circuit 13.

Figure 9:
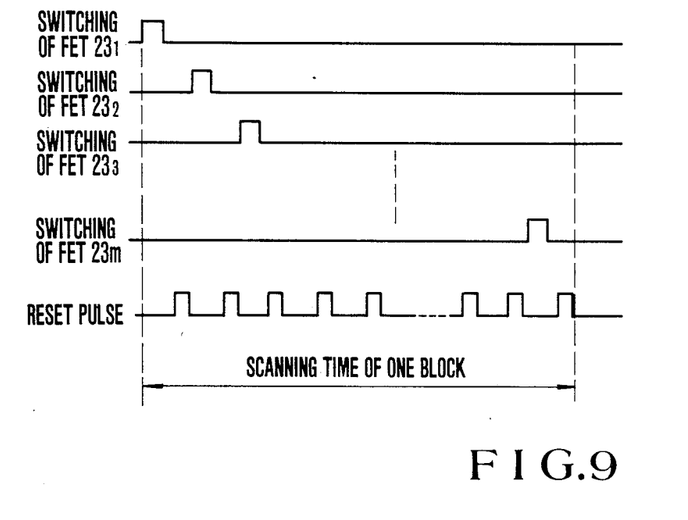
FIG. 9 is a timing chart for explaining the operation of the modified reading circuit shown in FIG. 8.

Although in the foregoing embodiment, for the purpose of resetting the integrator in the detection circuit 13a, reset pulses are simultaneously supplied to respective integrators at the end ($t_{m+1}$) of the scanning time of one block so as to initialize the reading circuit 13, the reading circuit may be reset by applying reset pulses to the read out integrators each time the output of respective integrator of the detection circuit 13a are read out. The relation between the reset pulses of respective switching transistors 23 is shown in FIG. 9. To execute such operation, the amplifier 27 shown in FIG. 8 may be constituted by an integrator which is reset by the reset pulse. The integrator 27 may be constructed as shown in FIG. 4, for example. Since only one integrator is provided, it is necessary to reset the integrator at each bit. However the resetting FET 25 of the detection circuit 13a is not necessary, thus simplifying the construction.

Figure 10:
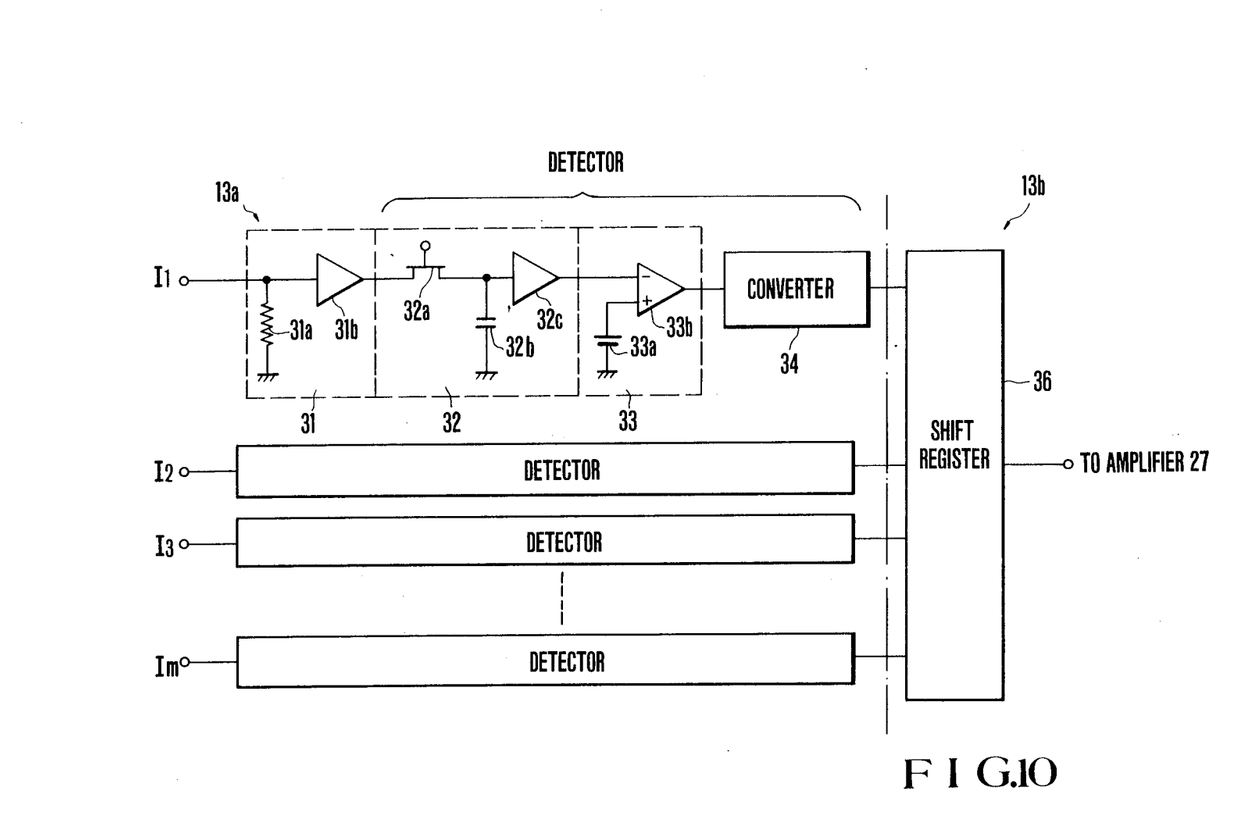
FIG. 10 is a block diagram showing another modification of the reading circuit.

FIG. 10 shows still further modification of FIG. 4 in which detectors respectively connected to the input terminals $I_1, I_2 \ldots I_m$ of the detection circuit 13a comprise a first stage detector 31 including a read out resistor 31a and a preamplifier 31b, a sample and hold circuit 32 including a transfer switching transistor 32a, an accumulation capacitor 32b and an amplifier 32c, a comparator 33 including a reference voltage source 33a storing a reference value and an operational amplifier 33b and a converter 34 of a TTL or CMOS level. In this modification the scanning circuit 13b is constituted by a parallel-serial conversion type shift register 36. In this modification the detection circuit 13a converts electric charge signals into binary signals of white and black level and the binary signals are sent to the shift register 36 and scanned by the shift register 36 constituting the scanning circuit 13b. Depending upon the construction of the succeeding signal processing system, the scanning by the shift register 36 is not performed, but the signal of one block may be processed as it is when the number of elements of each block is 8 and when the signal of each block is processed with a 8 bit microprocessor the construction of the succeeding signal processing circuit can be simplified.

Where the amplifier 27 of the scanning circuit 13b is constituted by an integrator, all charges accumulated in the charge accumulation capacitor 24 flow to the integrator via the transistor 23, so that it is not necessary to use the resetting transistor 25.

Figure 11:
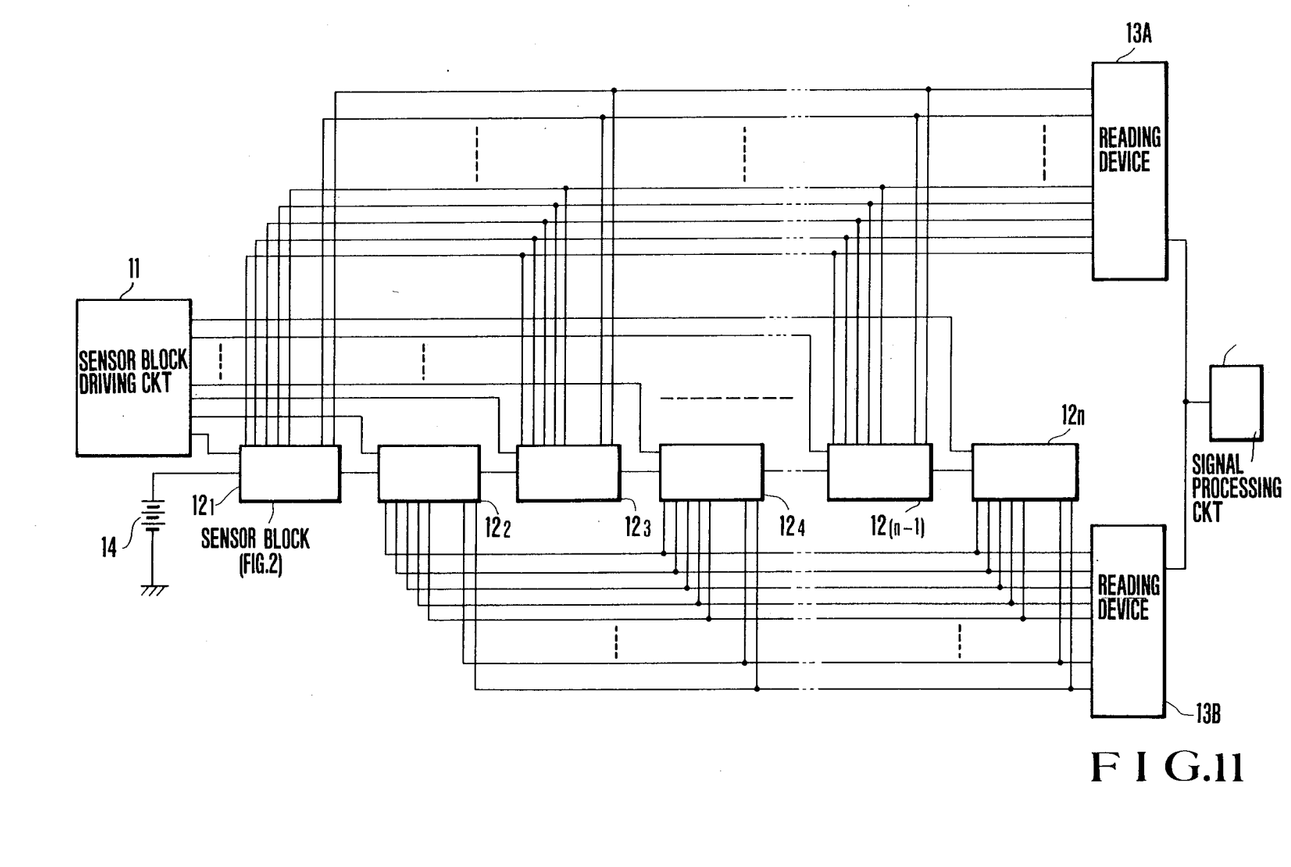
FIG. 11 is a block diagram showing a modified embodiment of this invention.
Figure 12:
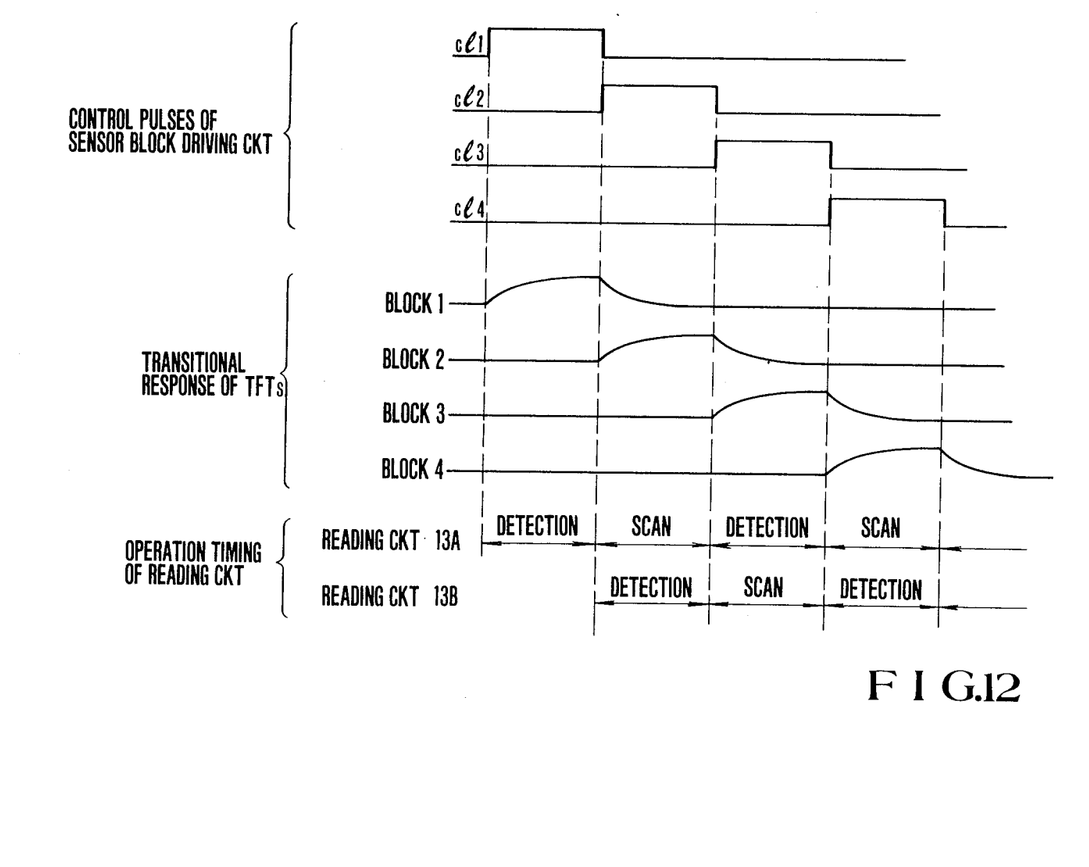
FIG. 12 is a timing chart useful to explain the operation of this invention.

FIG. 11 shows still further modification of this invention which is different from FIG. 1 in that the sensor blocks are divided into an odd number group and an even number group, that these groups are read with different reading devices 13A and 13B and that the outputs of these reading devices are alternatively supplied to the signal processing device 17. More particularly, sensor blocks $12_1, 12_3, 12_5 \ldots$ send their outputs to the reading circuit 13A, whereas sensor blocks $12_2, 12_4, 12_6 \ldots$ send their outputs to the reading circuit 13B.

The sensor block driving circuit 11 turns ON the thin film transistor array $19_{11}$ through $19_{1m}$ of the sensor block $12_1$ and the detection of the signal charges accumulated in the first through mth bit sensor elements $18_{11}$ through $18_{1m}$ is commenced by a detection circuit of the reading circuit 13A. Since the response of the thin film transistor 19 is slow, the switching time of the block should be determined by considering this fact. As the thin film transistor 19 becomes substantially steady state, the detection of the signal of the sensor block $12_1$ is completed. Then the control pulse of the sensor block $12_1$ is ceased and the switching of sensor block $12_2$ begins. Then the detection of the signal of sensor block $12_2$ by the reading circuit 13B begins. Meanwhile, the reading circuit 13A scans first to mth bits of the sensor block $12_1$ which have been detected by the detecting circuit. Thereafter, two reading circuits 13A and 13B repeat alternate detecting and scanning so as to read signals up to nth sensor block.

As above described, by simultaneously switching the thin film transistors in one sensor block so as to transfer the signal charges, even when thin film transistors having a slow response characteristic are used, it is possible to increase the effective scanning speed. For example, when thin film transistors having a response time of 100 microsec. are used and when one sensor block comprises 10 bits, it takes 2 msec. (considering OFF times) for switching 10 bits when individual thin film transistors are switched. However, according to this invention, switching can be effected in 100 microsec., which is only 1/20 the previous time. In other words the same switching speed can be obtained as if the response times of the film transistors were increased by 20 times. Further, the switching speed of the scanning switch of the scanning circuit may be about 10 microsec. This is substantially equal to that where the device of this invention is not used.

What is claimed is:

1. A thin film photoelectric converting device comprising:
    a plurality of sensor blocks, each block including a thin film transistor array which is paired with a storage type image sensor array, said thin film transistor array and said image sensor array being formed on the same insulating substrate;
    means for simultaneously turning ON as a group the thin film transistors in each block and for sequentially driving the thin film transistors of said blocks; and
    reading means comprising detection means and scanning means for sequentially reading electric charge signals sensed by the storage type image sensor elements in each block;
    said detection means including a plurality of detectors of the same number as that of sensor elements in each block, said detectors simultaneously detecting electric charge signals of said image sensor elements in each block, and said scanning means scanning and reading out outputs of said detectors wherein each of said image sensor elements is a sensor constituted by a first transparent electrode array on a dielectric substrate, a silicon insulating film deposited on said electrode in a predetermined pattern, a high resistance amorphous silicon film deposited on said silicon insulating film, a P type amorphous silicon film deposited on said amorphous silicon, and a second electrode deposited on said amorphous silicon film, said silicon insulating film and said P type amorphous silicon film acting as blocking layers for preventing undesired charge injection.

2. The thin film photoelectric converting device according to claim 1, wherein each of said thin film transistors comprises a transistor film made of amorphous silicon, a gate electrode arranged on said transistor film through an insulating film, souce and drain electrodes arranged on said transistor film.

3. The thin film photoelectric converting device according to claim 1, wherein each of said detectors comprises an integrator sample and hold circuit, and said scanning means comprises an analog switch.

4. The thin film photoelectric converting device according to claim 1 wherein said detection means includes a binary converter for converting said electric charge signals into binary signals, and said scanning means comprises a shift register for scanning coded binary signals.

5. The thin film photoelectric converting device according to claim 1, wherein said reading means comprises first and second reading means, and wherein said sensor blocks are divided into an odd number group and an even number group, outputs of said sensor blocks belonging to the odd number group being sent to said first reading means, and outputs of said sensor blocks belonging to the even number group being sent to said second reading means.

* * * * *